United States Patent
Ishibashi

(10) Patent No.: US 10,163,664 B2
(45) Date of Patent: Dec. 25, 2018

(54) SUBSTRATE CLEANING APPARATUS AND SUBSTRATE CLEANING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/523,078

(22) PCT Filed: Oct. 20, 2015

(86) PCT No.: PCT/JP2015/005279
§ 371 (c)(1),
(2) Date: Apr. 28, 2017

(87) PCT Pub. No.: WO2016/067562
PCT Pub. Date: May 6, 2016

(65) Prior Publication Data
US 2017/0316960 A1    Nov. 2, 2017

(30) Foreign Application Priority Data

Oct. 31, 2014  (JP) .................................. 2014-223715

(51) Int. Cl.
B08B 7/00   (2006.01)
B08B 7/04   (2006.01)
(Continued)

(52) U.S. Cl.
CPC ........ H01L 21/67046 (2013.01); A46B 13/00 (2013.01); B08B 1/04 (2013.01);
(Continued)

(58) Field of Classification Search
CPC ......... H01L 21/67046; H01L 21/02052; H01L 21/304; H01L 21/68728; H01L 21/67253; B08B 1/04; B08B 3/022; A46B 13/00
See application file for complete search history.

(56) References Cited

U.S. PATENT DOCUMENTS 5,829,087 A  * 11/1998  Nishimura ........ H01L 21/67046
                                                15/102
6,059,891 A  *  5/2000  Kubota ................... B08B 1/007
                                                134/1.3
(Continued)

FOREIGN PATENT DOCUMENTS

CN   101045230 A   10/2007
CN   101075553 A   11/2007
(Continued)

OTHER PUBLICATIONS

International Patent Application No. PCT/JP2015/005279; Int'l Search Report; dated Jan. 19, 2016; 5 pages.
(Continued)

*Primary Examiner* — Alexander Markoff
(74) *Attorney, Agent, or Firm* — Baker & Hostetler LLP

(57) ABSTRACT

A substrate cleaning apparatus (50) that cleans a substrate (S) includes: circumference supporting members (51) that support and rotate the substrate (S); a sponge (541) having a cleaning surface that is brought into contact with the surface to be cleaned of the substrate (S) being rotated by the circumference supporting members (51), and cleans the surface to be cleaned; an arm (53) that moves the sponge (541) in a radial direction of the substrate (S) while maintaining the cleaning surface in contact with the surface to be cleaned; and a controller (60) that controls the contact pressure of the cleaning surface on the surface to be cleaned. When the sponge (541) is located near the edge of the substrate (S), the controller (60) adjusts the contact pressure to a smaller value than that of when the sponge (541) is located near the center of the substrate (S).

7 Claims, 18 Drawing Sheets

(51) Int. Cl.
*H01L 21/67* (2006.01)
*B08B 1/04* (2006.01)
*H01L 21/304* (2006.01)
*B08B 3/02* (2006.01)
*H01L 21/02* (2006.01)
*A46B 13/00* (2006.01)
*H01L 21/687* (2006.01)

(52) U.S. Cl.
CPC ........ *B08B 3/022* (2013.01); *H01L 21/02052* (2013.01); *H01L 21/304* (2013.01); *H01L 21/67253* (2013.01); *H01L 21/68728* (2013.01)

(56) References Cited

U.S. PATENT DOCUMENTS

| | | | | |
|---|---|---|---|---|
| 6,740,171 | B2* | 5/2004 | Shimata | B08B 1/00 134/18 |
| 7,979,942 | B2* | 7/2011 | Hiraoka | B08B 1/04 15/102 |
| 2007/0226925 | A1 | 10/2007 | Hiraoka et al. | |
| 2007/0226926 | A1* | 10/2007 | Hiraoka | B08B 1/04 15/102 |
| 2007/0267047 | A1 | 11/2007 | Hori et al. | |
| 2009/0073394 | A1 | 3/2009 | Miyagi et al. | |
| 2013/0040456 | A1 | 2/2013 | Eda et al. | |
| 2013/0213437 | A1 | 8/2013 | Ishii et al. | |
| 2014/0102474 | A1 | 4/2014 | Takiguchi et al. | |
| 2014/0120725 | A1 | 5/2014 | Miyazaki et al. | |
| 2014/0158160 | A1* | 6/2014 | Ishibashi | H01L 21/67046 134/6 |

FOREIGN PATENT DOCUMENTS

| | | |
|---|---|---|
| CN | 103786091 A | 5/2014 |
| EP | 1848028 B1 | 7/2012 |
| JP | H10-223597 A | 8/1998 |
| JP | H11-040530 A | 12/1999 |
| JP | 2002-113429 A | 4/2002 |
| JP | 2009-071026 A | 4/2009 |
| JP | 2013-172019 A | 9/2013 |
| KR | 10-1999-0014121 | 2/1999 |
| WO | WO 2004/006305 A1 | 1/2004 |

OTHER PUBLICATIONS

Taiwan Patent Application No. 104135205; Notice of Allowance; dated Sep. 11, 2017; 4 pages.
China Patent Application No. 201580059263.2; Office Action; dated Nov. 23, 2017; 10 pages.
Korea Patent Application No. 10-2017-7009473; Reason for Refusal; dated Aug. 14, 2017; 10 pages.

* cited by examiner

SUBSTRATE CLEANING APPARATUS AND SUBSTRATE CLEANING METHOD

CROSS-REFERENCE TO RELATED APPLICATIONS

The present disclosure is a 371 U.S. National Stage Application of Patent Application No. PCT/JP2015/005279 filed on Oct. 20, 2015, which claims the benefit of priority from Japanese Patent Application No. 2014-223715, filed on Oct. 31, 2014, the entire contents of which are incorporated herein by reference.

TECHNICAL FIELD

The present technology relates to substrate cleaning apparatuses and substrate cleaning methods for cleaning substrates such as semiconductor wafers, and more particularly, to a substrate cleaning apparatus and a substrate cleaning method for cleaning the surface of a substrate while moving a cleaning head in a radial direction of the substrate.

BACKGROUND ART

As semiconductor devices have become smaller in size, substrates with microstructures (substrates formed with material films that vary in physical properties) are being processed these days. For example, in a damascene interconnect formation process in which wiring grooves formed in a substrate are filled with metal, extra metal is removed by polishing performed by a substrate polishing system (CMP system) after the damascene interconnect formation, and thus, materials films (such as a metal film, a barrier film, and an insulating film) that vary in physical properties are formed on the substrate surface. On such a substrate surface, there are residues of the slurry used in CMP and metal grinding sludge (such as Cu grinding sludge). Therefore, in a case where a substrate surface cannot be sufficiently cleaned, such as a case where complexity of a substrate surface makes the cleaning difficult, leakage or an adhesion defect occurs due to residues or the like, and might result in a decrease in reliability. To counter this, a CMP system that polishes semiconductor substrates conducts cleaning after the polishing. In the cleaning process, pen scrub cleaning or two-fluid jet cleaning is performed, for example (see Patent Literatures 1 and 2, for example).

CITATION LIST

Patent Literatures

Patent Literature 1: JP 2013-172019 A
Patent Literature 2: JP 11-40530 A

SUMMARY OF INVENTION

Problem to be Solved

In a conventional substrate cleaning apparatus, when a substrate surface is subjected to pen scrub cleaning, the substrate is rotated, and a cleaning head formed with a rotating sponge moves on the substrate surface in a radial direction of the substrate. Substrate cleaning is then conducted. FIG. 12 is a plan view and a front view of a cleaning head at radial positions on a substrate. FIG. 12 shows a cleaning head H1 located near the center of a substrate S, a cleaning head H2 located between the center and the edge of the substrate, and a cleaning head H3 located near the edge of the substrate S.

As the substrate S is supported at the edge, the central portion of the substrate S sinks due to its own weight, and the shape of the entire substrate has a curved shape that protrudes downward, as shown in the front view in FIG. 12. In this case, the surface of the substrate S has different heights near the center and near the edge of the substrate S. Specifically, the surface near the center of the substrate S is lower than the surface near the edge of the substrate S. If the sponge is held at the same height when the cleaning head is located near the center and when the cleaning head is located near the edge, the sponge of the cleaning head is in contact with the surface of the substrate S with an appropriate contact pressure in the vicinity of the center of the substrate S, but the contact pressure becomes higher as the cleaning head becomes closer to the edge of the substrate S. Such unevenness in contact pressure is more conspicuous in a larger substrate.

FIGS. 13A through 13C are a cross-sectional view taken along the line A-A' in FIG. 12, a cross-sectional view taken along the line B-B' in FIG. 12, and a cross-sectional view taken along the line C-C' in FIG. 12, respectively. In FIGS. 13A through 13C, the substrate S is moving to the left in each drawing. As shown in FIG. 12 and FIGS. 13A through 13C, the sponge of the cleaning head is dragged by the substrate because of the frictional force between the substrate and the sponge, and is thus deformed. In a case where the cleaning head moves in a radial direction, if the rotating speed of the substrate is constant, the moving speed of the surface of the substrate S in contact with the cleaning head becomes higher relative to the cleaning head as the cleaning head moves outward in the radial direction of the substrate S. Therefore, as shown in FIGS. 13A and 13B, the cleaning head deformation due to the dragging by the substrate is greater when the cleaning head is located at an outer portion in the radial direction of the substrate. Such deformation is more conspicuous where the radius of the substrate is greater.

As the cleaning head is deformed, the cleaning head, which is originally designed to have a circular contact surface slidably in contact with the substrate surface, is pressed as shown in the plan view in FIG. 12, and the cleaning performance of the cleaning head deteriorates. Further, when the cleaning head rotates about an axis perpendicular to the substrate, the frictional force generated by the rotating substrate and the torque generated by the rotating cleaning head are applied to the sponge in a complicated manner, and great stress is locally applied to the sponge. As a result, the sponge can be detached from the holder.

The present technology has been made in view of the above problem, and an object thereof is to provide a novel substrate cleaning apparatus and a novel substrate cleaning method for cleaning the surface of substrate while moving a cleaning head in a radial direction of the substrate.

Solution to Problem

A substrate cleaning apparatus that cleans a substrate according to one embodiment includes: a substrate rotating supporter configured to support and rotate the substrate; a scrubbing member comprising a cleaning surface configured to clean a surface to be cleaned of the substrate being rotated by the substrate rotating supporter, the cleaning surface being brought into contact with the surface to be cleaned; a movement mechanism configured to move the scrubbing member in a radial direction of the substrate while maintaining the cleaning surface in contact with the surface to be cleaned; and a controller configured to control a contact pressure of the cleaning surface on the surface to be cleaned, wherein the controller sets the contact pressure of when the scrubbing member is located near an edge of the substrate to be smaller than the contact pressure of when the scrubbing member is located near a center of the substrate.

In this structure, the controller controls the contact pressure of the cleaning surface of the scrubbing member. Even in a case where the height of the surface near the edge is greater than the height of the surface near the center since the substrate is supported at the edge, the contact pressure can be prevented from becoming an unintended contact pressure due to the difference in height. Furthermore, the contact pressure near the edge at which the moving speed of the surface to be cleaned is high is reduced to a smaller value than the contact pressure near the center. Accordingly, it is possible to reduce the stress to be applied onto the scrubbing member when the cleaning surface of the scrubbing member in contact with the surface of the substrate to be cleaned is dragged by the surface to be cleaned that moves with the rotation of the substrate. Thus, the possibility of deformation or detachment of the scrubbing member can be lowered.

In the substrate cleaning apparatus, the controller may further control movement of the scrubbing member by the movement mechanism, and set a moving speed of the scrubbing member of when the scrubbing member is located near the edge of the substrate to be smaller than the moving speed of when the scrubbing member is located near the center of the substrate.

In this structure, in the vicinity of the edge where the moving speed of the surface to be cleaned of the substrate is high and the time of contact per unit area with the cleaning surface of the scrubbing member is short, the number of contact times can be increased by lowering the moving speed of the scrubbing member in a radial direction to a lower speed than in the vicinity of the center. Thus, the cleaning performance near the edge can be improved.

The substrate cleaning apparatus may further include a rotation mechanism configured to rotate the scrubbing member, wherein the controller further controls rotation of the scrubbing member by the rotation mechanism, and sets a rotating speed of the scrubbing member of when the scrubbing member is located near the edge of the substrate to be greater than the rotating speed of when the scrubbing member is located near the center of the substrate.

In this structure, it is possible to reduce degradation of the cleaning performance due to the decrease in the contact pressure between the surface to be cleaned of the substrate and the cleaning surface of the scrubbing member near the edge of the substrate. Furthermore, in a case where the moving speed of the scrubbing member is lowered near the edge of the substrate, an effect to improve the cleaning performance by virtue of the rotation of the scrubbing member is expected. Thus, the decrease in the moving speed of the scrubbing member can be reduced, and the decrease in productivity due to the decrease in the moving speed of the scrubbing member can be reduced accordingly.

In the substrate cleaning apparatus, the controller may control rotation of the substrate by the substrate rotating supporter, and set a rotating speed of the substrate of when the scrubbing member is located near the edge of the substrate to be greater than the rotating speed of when the scrubbing member is located near the center of the substrate.

In a case where the scrubbing member moves in a radial direction of the substrate at a constant speed, the number of times the scrubbing member is brought into contact with the substrate becomes smaller as the scrubbing member becomes closer to the edge of the substrate. However, such a decrease in the number of contact times can be reduced or avoided, if the rotating speed of the substrate at a time when the scrubbing member is located near the edge of the substrate is made higher than at a time when the scrubbing member is located near the center of the substrate as in the above described structure. Furthermore, to reduce such a decrease in the number of contact times, the moving speed of the scrubbing member at a time when the scrubbing member is located near the edge of the substrate may be made lower than at a time when the scrubbing member is located near the center of the substrate. In such a case, the decrease in the moving speed of the scrubbing member can be reduced, if the rotating speed of the substrate at a time when the scrubbing member is located near the edge of the substrate is made higher than at a time when the scrubbing member is located near the center of the substrate as in the above described structure. Thus, the decrease in productivity can be reduced.

In the substrate cleaning apparatus, the controller may vary the contact pressure while the cleaning surface is in contact with the center of the substrate.

In this structure, in the vicinity of the center of the substrate, it is also possible to control the contact pressure in accordance with the location of the scrubbing member in a radial direction of the substrate.

In the substrate cleaning apparatus, the movement mechanism may moves the scrubbing member on a predetermined movement locus comprising a location where the cleaning surface overlaps the edge of the substrate, and the controller may set the contact pressure of when the cleaning surface overlaps the edge of the substrate to be smaller than the contact pressure of when the cleaning surface does not overlap the edge of the substrate.

In this structure, a problem, such as deterioration of the scrubbing member due to a high contact pressure of the scrubbing member on the edge of the substrate, can be alleviated.

A substrate cleaning apparatus that cleans a substrate according to another embodiment includes: a substrate rotating supporter configured to support and rotate the substrate; a scrubbing member comprising a cleaning surface configured to clean a surface to be cleaned of the substrate being rotated by the substrate rotating supporter, the cleaning surface being brought into contact with the surface to be cleaned; a rotation mechanism configured to rotate the scrubbing member; a movement mechanism configured to move the scrubbing member in a radial direction of the substrate while maintaining the cleaning surface in contact with the surface to be cleaned; and a controller configured to control a contact pressure of the cleaning surface on the surface to be cleaned, wherein, the movement mechanism moves the scrubbing member on a predetermined movement locus comprising a location where the cleaning surface overlaps an edge of the substrate, and the controller sets the contact pressure of when the cleaning surface overlaps the edge of the substrate to be smaller than the contact pressure of when the cleaning surface does not overlap the edge of the substrate.

In this structure, a problem, such as deterioration of the scrubbing member due to a high contact pressure of the scrubbing member on the edge of the substrate, can be alleviated.

A substrate cleaning method of cleaning a substrate according to one embodiment, the method includes: supporting and rotating the substrate; and moving a scrubbing member in a radial direction of the substrate while maintaining a cleaning surface of the scrubbing member in contact with a surface to be cleaned of the substrate, wherein a contact pressure of the cleaning surface on the surface to be cleaned of when the scrubbing member is located near an edge of the substrate is set to be smaller than the contact pressure of when the scrubbing member is located near a center of the substrate.

In this structure, the contact pressure of the cleaning surface of the scrubbing member is controlled. Even in a case where the height of the surface near the edge is greater than the height of the surface near the center since the substrate is supported at the edge, the contact pressure can be prevented from becoming an unintended contact pressure due to the difference in height. Furthermore, the contact pressure near the edge at which the moving speed of the surface to be cleaned is high is reduced to a smaller value than the contact pressure near the center. Accordingly, it is possible to reduce the stress to be applied onto the scrubbing member when the cleaning surface of the scrubbing member in contact with the surface of the substrate to be cleaned is dragged by the surface to be cleaned that moves with the rotation of the substrate. Thus, the possibility of deformation or detachment of the scrubbing member can be lowered.

A substrate cleaning method of cleaning a substrate according to another embodiment includes: supporting and rotating the substrate; moving a scrubbing member in a radial direction of the substrate on a predetermined movement locus comprising a location where a cleaning surface of the scrubbing member overlaps an edge of the substrate while maintaining the cleaning surface of the scrubbing member in contact with a surface to be cleaned of the substrate; and rotating the scrubbing member, wherein a contact pressure of when the cleaning surface overlaps the edge of the substrate is set to be smaller than the contact pressure of when the cleaning surface does not overlap the edge of the substrate.

In this structure, a problem, such as deterioration of the scrubbing member due to a high contact pressure of the scrubbing member on the edge of the substrate, can also be alleviated.

A substrate cleaning apparatus that cleans a substrate according to another embodiment includes: a substrate rotating supporter configured to support and rotate the substrate; a two-fluid nozzle configured to jet a mixture of liquid and gas to a surface to be cleaned of the substrate being rotated by the substrate rotating supporter; a movement mechanism configured to move the two-fluid nozzle in a radial direction of the substrate; and a controller configured to control a flow amount of the liquid and/or the gas to be supplied to the two-fluid nozzle, wherein the controller sets the flow amount of the liquid and/or the gas of when the two-fluid nozzle is located near an edge of the substrate to be smaller than the flow amount of when the two-fluid nozzle is located near a center of the substrate.

In the vicinity of the edge of the substrate, the speed of the substrate relative to the two-fluid nozzle is high. Therefore, the substrate is damaged due to jetting from the two-fluid jet in some cases. In the above described structure, however, the flow amount of liquid and/or the flow amount of gas at a time when the two-fluid nozzle is located near the edge of the substrate are (is) made lower than at a time when the two-fluid nozzle is located near the center of the substrate. Accordingly, when the two-fluid nozzle is located near the edge of the substrate, the kinetic energy of the liquid to be jetted is smaller than that of when the two-fluid nozzle is located near the center of the substrate. Thus, the above mentioned damage can be reduced or avoided.

DESCRIPTION OF EMBODIMENTS

The following is a description of a substrate cleaning apparatus according to an embodiment of the present technology. It should be noted that the embodiment described below is an example case where the present technology is embodied, and does not limit the present technology to the specific structures described below. In embodying the present technology, any appropriate specific structure according to an embodiment may be employed. In the embodiment described below, a substrate cleaning apparatus to be used in a CMP system or the like that polishes semiconductor substrates is explained as an example.

Figure 1:
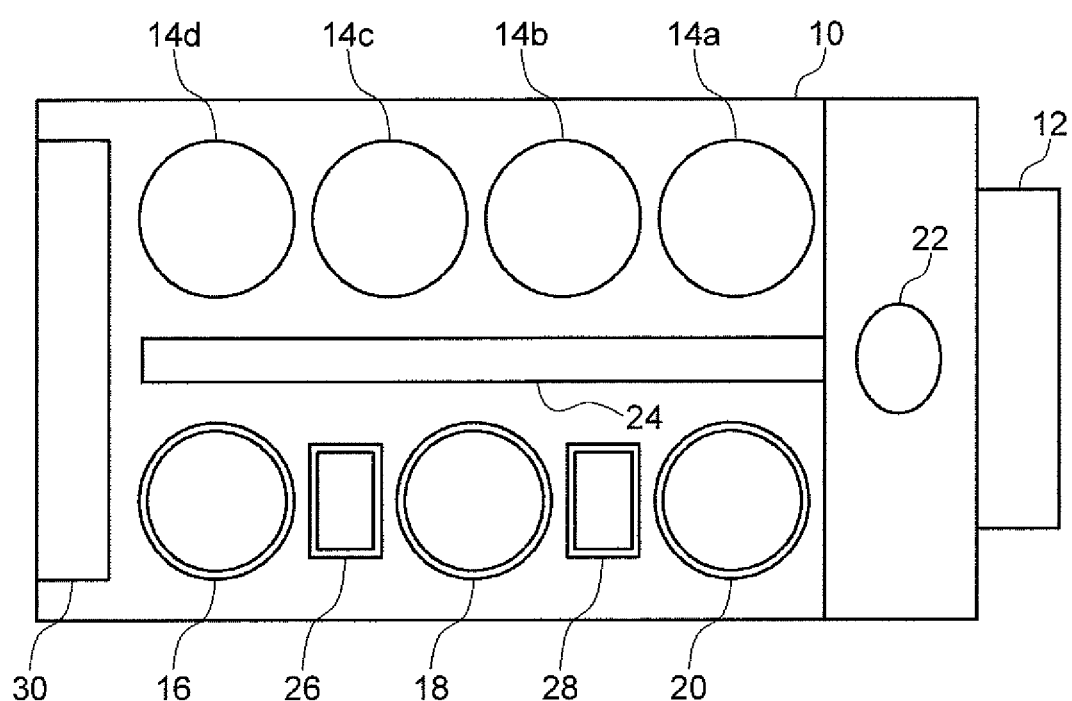
FIG. 1 is a plan view of a substrate processing apparatus that includes substrate cleaning apparatuses according to an embodiment of the present technology.

FIG. 1 is a plan view of the entire structure of a substrate processing apparatus that includes substrate cleaning apparatuses (cleaning units) according to an embodiment of the present technology. As shown in FIG. 1, the substrate processing apparatus includes a housing 10 of a substantially rectangular shape, and a load port 12 in which a substrate cassette that stores a large number of substrates such as semiconductor wafers is mounted. The load port 12 is disposed adjacent to the housing 10. It is possible to mount an open cassette, a standard manufacturing interface (SMIF) pod, or a front opening unified pod (FOUP) in the load port 12. A SMIF and a FOUP are an airtight container that can maintain an environment isolated from the external space by housing a substrate cassette therein and covering the substrate cassette with partitions.

The housing 10 houses four polishing units 14a through 14d, cleaning units (a first cleaning unit 16 and a second cleaning unit 18) that clean polished substrates, and a drying unit 20 that dries cleaned substrates. The cleaning units (the first cleaning unit 16 and the second cleaning unit 18) may form a vertical two-tier structure in which the cleaning units are arranged in an upper tier and a lower tier. The polishing units 14a through 14d are aligned in the longitudinal direction of the substrate processing apparatus, and the cleaning units 16 and 18 and the drying unit 20 are also aligned in the longitudinal direction of the substrate processing apparatus. Substrate cleaning apparatuses of the embodiment of the present technology can be used as the first cleaning unit 16 and the second cleaning unit 18.

A first substrate conveying robot 22 is disposed in the region surrounded by the load port 12, and the polishing unit 14a and the drying unit 20 located on the side of the load port 12, and a substrate conveying unit 24 is disposed parallel to the polishing units 14a through 14d. The first substrate conveying robot 22 receives substrates yet to be polished from the load port 12, and transfers the substrates to the substrate conveying unit 24. The first substrate conveying robot 22 also receives dried substrates from the drying unit 20, and transfers the dried substrates to the load port 12. The substrate conveying unit 24 conveys substrates received from the first substrate conveying robot 22, and transfers the substrates to the respective polishing units 14a through 14d.

A second substrate conveying robot 26 that transfers substrates between the first cleaning unit 16 and the second cleaning unit 18 is disposed between the first cleaning unit 16 and the second cleaning unit 18. A third substrate conveying robot 28 that transfers substrates between the second cleaning unit 18 and the drying unit 20 is disposed between the second cleaning unit 18 and the drying unit 20. Further, a controller 30 that controls operations of the respective apparatuses in the substrate processing apparatus is disposed in the housing 10.

Figure 2:
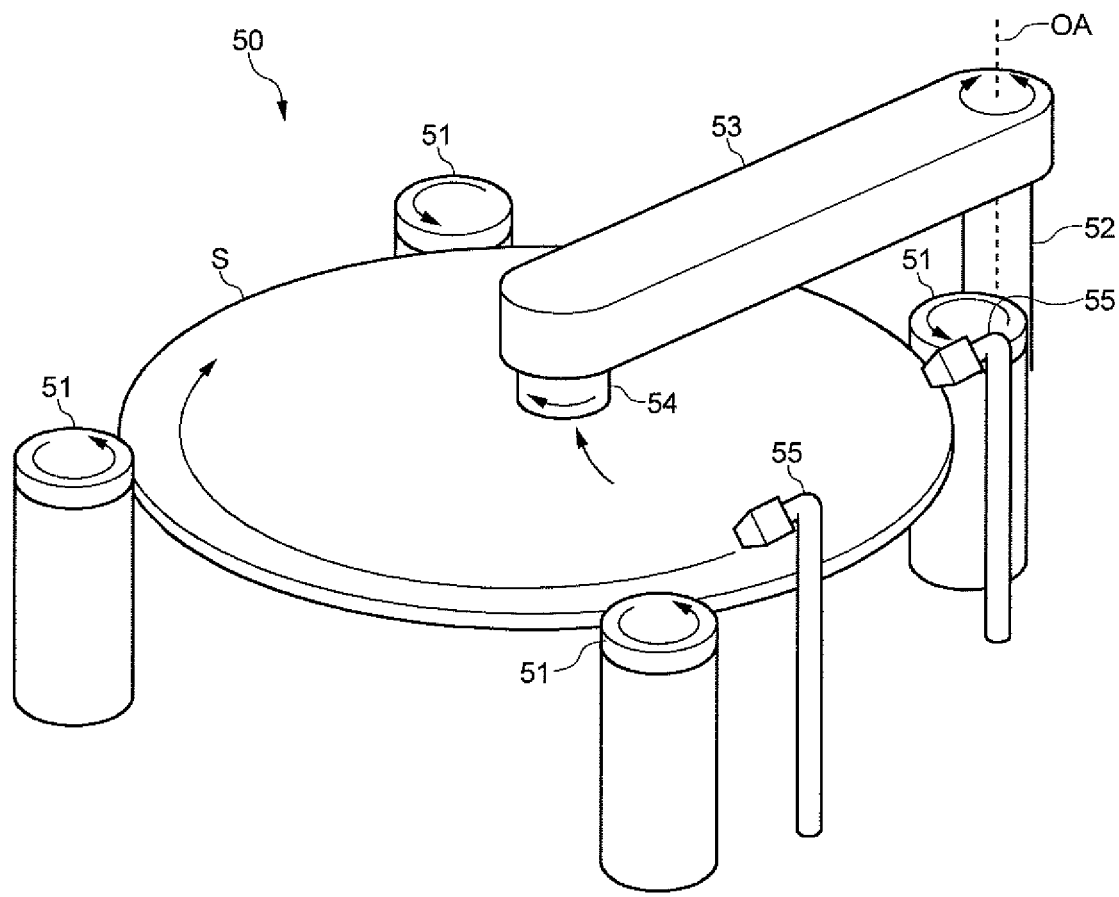
FIG. 2 is a perspective view of a substrate cleaning apparatus according to the embodiment of the present technology.
Figure 3:
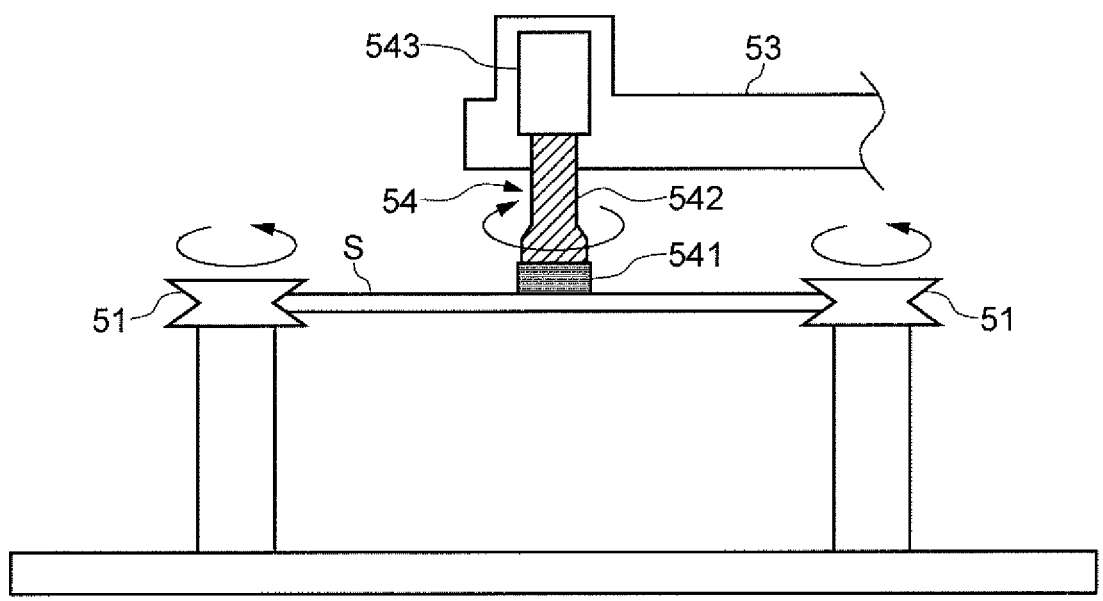
FIG. 3 is a side view of the substrate cleaning apparatus according to the embodiment of the present technology.
Figure 4:
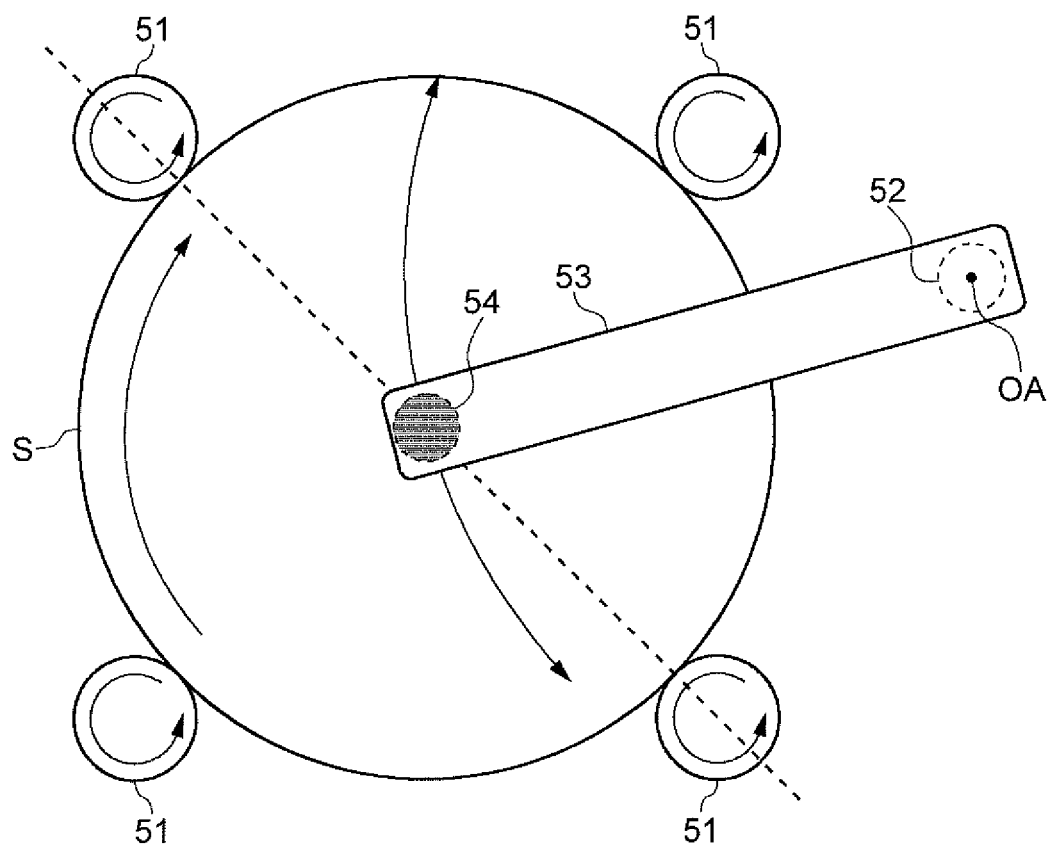
FIG. 4 is a plan view of the substrate cleaning apparatus according to the embodiment of the present technology.

FIG. 2 is a perspective view of the structure of a substrate cleaning apparatus (cleaning unit) of this embodiment. FIG. 3 is a side view of the structure of the substrate cleaning apparatus (cleaning unit). FIG. 4 is a plan view of the structure of the substrate cleaning apparatus (cleaning unit). As shown in FIGS. 2 through 4, a substrate cleaning apparatus 50 includes four circumference supporting members 51 that support a substrate S at the circumference. The circumference supporting members 51 are formed with rotatable rollers that nip the edge of the substrate S in the vertical direction. In this embodiment, the four circumference supporting members 51 are located in the same horizontal plane, and the substrate S is horizontally supported by these four circumference supporting members 51, with its front surface (the surface to be polished) facing upward. Some or all of the four circumference supporting members 51 are rotatively driven, and thus, the supported substrate S rotates. The circumference supporting member(s) 51 that is (are) not rotatively driven follow(s) the rotation of the substrate S, and thus rotate(s). The circumference supporting members 51 corresponds to the substrate rotating member.

The substrate cleaning apparatus 50 includes an arm support pillar 52 designed to vertically stand, an arm 53 elevatably and rotatably supported by the arm support pillar 52, and a cleaning head 54 supported by the lower portion of the end of the arm 53. Further, nozzles 55 that supply a cleaning solution (a cleaning liquid (chemical liquid), slurry, or pure water) to the surface (upper surface) of the substrate S stand by the substrate S supported by the circumference supporting members 51. The structure formed with the arm support pillar 52 and the arm 53 is equivalent to the movement mechanism.

As shown in FIG. 4, the arm 53 rotates about a swing center OA. With this, the cleaning head 54 attached to the end of the arm 53 swings on the substrate S and moves along the surface of the substrate S as if drawing an arc. The arm 53 moves the cleaning head 54 on the substrate S in a radial direction of the substrate S so that the cleaning head 54 passes through the center of the substrate S. The arm 53 also moves the cleaning head 54 on the substrate S so that the cleaning head 54 reaches the edge of the substrate S. That is, the movement locus of the cleaning head 54 passes through the center of the substrate S, and even covers the edge of the substrate S.

As shown in FIG. 3, the cleaning head 54 includes a sponge 541 as a scrubbing member, a holder 542 that holds the sponge, and a driver 543 that lifts up and down and rotates the holder 542. The driver 543 is provided inside the arm 53. The holder 542 is supported in a position perpendicular to the substrate S by the driver 543, and the driver 543 rotates the holder 542 about a rotation axis perpendicular to the substrate S. The driver 543 also lifts up or lowers the holder 542 in a direction perpendicular to the substrate S. The driver 543 is equivalent to the rotation mechanism.

The sponge 541 is secured to the lower end of the holder 542, and rotates with the holder 542. The sponge 541 has a circular cylindrical shape, and the circular bottom surface (polishing surface) thereof is brought into contact with the substrate S. The driver 543 brings the bottom surface of the sponge 541 into contact with the surface of the substrate S by lowering the holder 542. Furthermore, with the sponge 541 being in contact with the substrate S, the driver 543 lifts up and down the holder 542, to adjust the contact pressure of the sponge 541 on the surface of the substrate S. In this embodiment, the contact pressure of the sponge 541 on the surface of the substrate S is the pressing load per unit area of the sponge 541 on the surface of the substrate S.

Figure 5:
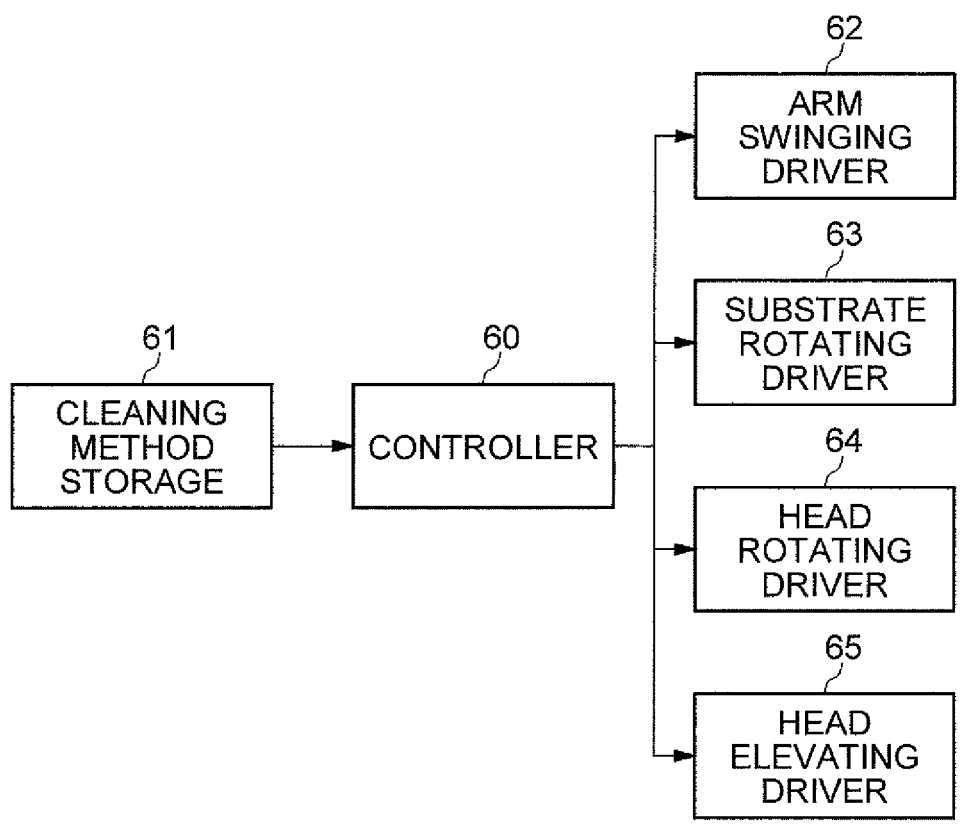
FIG. 5 is a block diagram showing the configuration of the control system of the substrate cleaning apparatus according to the embodiment of the present technology.

FIG. 5 is a block diagram showing the configuration of the control system of the substrate cleaning apparatus of this embodiment. The substrate cleaning apparatus 50 includes a controller 60 that controls cleaning operations thereof. This controller 60 may be the controller 30 of the substrate processing apparatus (see FIG. 1), or may be provided separately from the controller 30. The controller 60 is implemented by a computer executing a cleaning program of this embodiment, the computer including a memory and an arithmetic processing circuit. The substrate cleaning apparatus 50 includes a cleaning method storage 61, an arm swinging driver 62, a substrate rotating driver 63, a head rotating driver 64, and a head elevating driver 65, as well as the controller 60.

In the substrate cleaning apparatus 50 of the example shown in FIG. 5, the controller 60 controls the respective drivers 32 through 35, according to a cleaning recipe (cleaning method) stored in the cleaning method storage 61. However, the controller 60 may also perform a feedback control by a predetermined algorithm, in accordance with some sensing data obtained from the substrate cleaning apparatus 50. The cleaning method storage 61 stores control values (the cleaning recipe) for the respective drivers 32 through 35 in accordance with the progress of (the elapsed time in) a cleaning process.

The arm swinging driver 62 drives the arm 53 to swing about the swing center OA, so that the cleaning head 54 moves on an arcuate trajectory parallel to the surface of the substrate S. The substrate rotating driver 63 drives the circumference supporting members 51 to rotate, so that the substrate S rotates about the central axis. The head rotating driver 64 drives the driver 543 to rotate, so that the holder 542 and the sponge 541 held by the holder 542 rotate about the central axis. The head elevating driver 65 drives the driver 543 to move up and down, so that the sponge 541 is brought into contact with the substrate S or the sponge 541 in contact with the substrate S is detached from the substrate S, and the contact pressure of the sponge 541 on the substrate S is adjusted.

In this embodiment, the arm 53 is also driven to move up and down relative to the arm support pillar 52 as described above. Therefore, the driver 543 of the cleaning head 54 may not have the function to lift up and down the holder 542. In that case, the driver for lifting up and down the arm 53 relative to the arm support pillar 52 may be the head elevating driver 65, instead of the driver 543 or in addition to the driver 543. In this embodiment, the driver 543 brings the sponge 541 into contact with the substrate S or detaches the sponge 541 in contact with the substrate S from the substrate S, and adjusts the contact pressure of the sponge 541 on the substrate S. The driver for lifting up and down the arm 53 relative to the arm support pillar 52 is used in bringing the cleaning head 54 closer to the substrate S when the cleaning head 54 is at a distance from the substrate S, or in detaching the cleaning head 54 from the substrate S.

Figure 6:
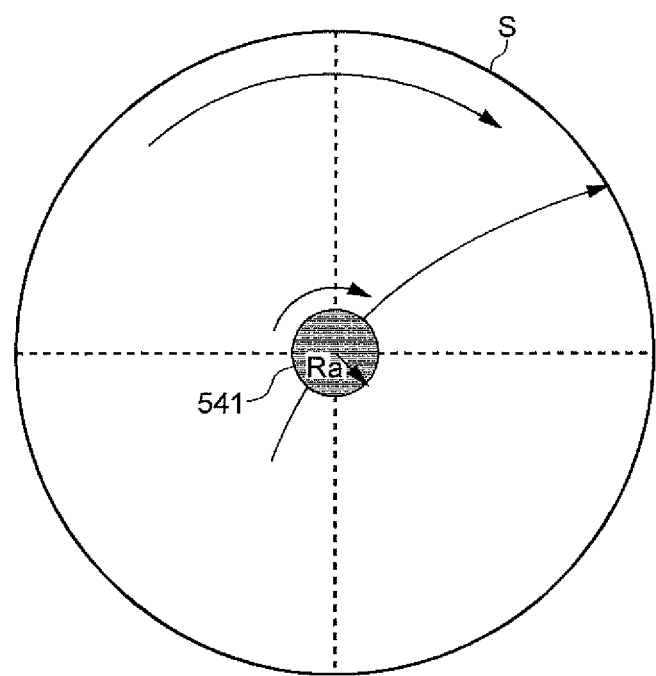
FIG. 6 is a diagram showing a movement locus of a sponge according to the embodiment of the present technology.
Figure 7:
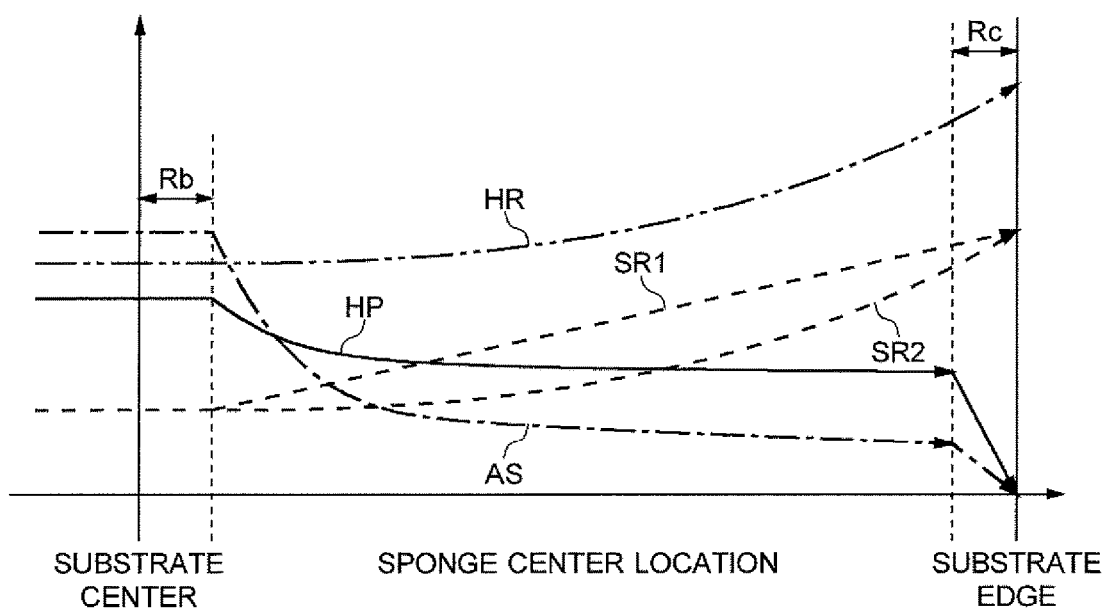
FIG. 7 is graphs showing the relationships among the location of the center of the sponge on the substrate, the rotating speed of the substrate, the moving speed of an arm, the contact pressure of a cleaning head on the substrate, and the rotating speed of the cleaning head in the embodiment of the present technology.

Next, a cleaning method to be implemented by the controller 60 in accordance with a cleaning recipe stored in the cleaning method storage 61 is described. FIG. 6 is a diagram showing the movement locus of the sponge. FIG. 7 is graphs showing the relationships among the location of the center of the sponge on the substrate, the rotating speed of the substrate, the moving speed of the arm, the contact pressure of the cleaning head on the substrate, and the rotating speed of the cleaning head.

The moving speed AS of the arm 53 varies with the location of the cleaning head 54 as shown in FIG. 7, as the controller 60 controls the arm swinging driver 62 in accordance with the cleaning recipe. The rotating speed SR of the substrate S varies with the location of the cleaning head 54 as shown in FIG. 7, as the controller 60 controls the substrate rotating driver 63 in accordance with the cleaning recipe. The rotating speed HR of the cleaning head 54 varies with the location of the cleaning head 54 as shown in FIG. 7, as the controller 60 controls the head rotating driver 64 in accordance with the cleaning recipe. The contact pressure HP of the cleaning head 54 on the substrate S varies with the location of the cleaning head 54 as shown in FIG. 7, as the controller 60 controls the head elevating driver 55 in accordance with the cleaning recipe. In the case described below, the cleaning head 54 moves from a point near the center of the substrate S toward the edge of the substrate S.

As shown in FIG. 6, the controller 60 controls the arm swinging driver 62, to move the cleaning head 54 from the center of the substrate S toward the edge of the substrate S. Here, the radius of the sponge 541 is represented by Ra. Before the center of the sponge 541 reaches a location at a distance Rb (Rb≤Ra) from the center of the substrate S, the controller 60 controls the arm swinging driver 62, the head elevating driver 65, and the substrate rotating driver 63, so that the moving speed AS of the arm 53, the contact pressure HP of the cleaning head 54 on the substrate S, and the rotating speed SR of the substrate S become constant.

When the center of the sponge 541 reaches a location at the distance Rb from the center of the substrate S, that is, before the sponge 541 completely passes through the center of the substrate S, the controller 60 controls the arm swinging driver 62 and the head elevating driver 65, so that the speed AS of the arm 53 and the contact pressure HP of the cleaning head 54 on the substrate S start decreasing.

After that, the controller 60 controls the arm swinging driver 62 and the head elevating driver 65, so that the moving speed AS of the arm 53 and the contact pressure HP of the cleaning head 54 on the substrate S become lower as the center of the sponge 541 becomes closer to the edge of the substrate S (or moves toward the outer side). At this point, the rate of decrease in the moving speed AS of the arm 53 and the rate of decrease in the contact pressure HP of the cleaning head 54 on the substrate S become lower as the center location of the sponge 541 become closer to the edge of the substrate S (or moves toward the outer side). Accordingly, the graphs representing these rates are curves slightly protruding downward as shown in FIG. 7.

When the center location of the sponge 541 reaches a location at a distance Rc (Rc≥Ra) from the edge of the substrate S as the cleaning head 54 approaches the edge of the substrate S, that is, before the outer rim of the sponge 541 reaches the edge of the substrate S, the controller 60 controls the arm swinging driver 62 and the head elevating driver 65, so that the moving speed AS of the arm 53 and the contact pressure HP of the cleaning head 54 on the substrate S start rapidly decreasing, and become zero at the time when the center of the sponge 541 reaches the edge of the substrate S, as shown in FIG. 7.

At a location where the distance between the outer rim of the sponge 541 and the edge of the substrate S is 0.5 mm to 1.0 mm before the outer rim of the sponge 541 reaches the edge of the substrate S, the moving speed AS of the arm 53 may be made 0, and thus, the arm 53 may be stopped. After the arm 53 is stopped, the arm 53 is again moved to such a location that the center of the sponge 541 reaches the edge of the substrate S.

When the center of the sponge 541 reaches a location at the distance Rb from the center of the substrate S, that is, before the sponge 541 completely passes through the center of the substrate S, the controller 60 controls the substrate rotating driver 63, so that the rotating speed SR of the substrate S starts increasing. At this point, the controller 60 may increase the rotating speed at a constant increase rate, as indicated by a rotating speed SR1, or may increase the rotating speed in such a manner that the rotating speed becomes higher as the center of the sponge 541 becomes closer to the edge of the substrate S (or moves toward the outer side), as indicated by a rotating speed SR2. As shown in FIG. 7, the graph representing the rotating speed SR1 is a straight line, and the graph representing the rotating speed SR2 is a curve slightly protruding downward.

Until the center of the sponge 541 reaches a location at the distance Rb from the center of the substrate S, the controller 60 controls the head rotating driver 64, so that the rotating speed HR of the cleaning head 54 becomes constant. When the center of the sponge 541 reaches a location at the distance Rb from the center of the substrate S, that is, before the sponge 541 completely passes through the center of the substrate S, the controller 60 controls the head rotating driver 64, so that the rotating speed of the cleaning head 54 becomes higher as the center of the sponge 541 becomes closer to the edge of the substrate S (or moves toward the outer side).

The cleaning recipe in the substrate cleaning apparatus 50 has been described above, and the effects of this cleaning recipe are now described below. If the rotating speed of the substrate S is constant, the speed of the surface of the substrate S relative to the cleaning head 54 becomes higher as the cleaning head 54 becomes closer to the edge of the substrate S. Accordingly, the contact time in each contact action between the sponge 541 and the surface of the substrate S becomes shorter. In this embodiment described above, however, the controller 60 controls the arm swinging driver 62 so that the moving speed AS of the arm 53, which is the moving speed of the cleaning head 54 in a radial direction of the substrate S, becomes lower as the cleaning head 54 becomes closer to the edge of the substrate S. In this manner, the number of times the sponge 541 comes into contact with the surface of the substrate S increases, and the total contact time can be made longer. As described above, the moving speed AS of the arm 53 is made lower as the cleaning head 54 becomes closer to the edge of the substrate S. Thus, it is possible to achieve higher cleaning performance than with a substrate cleaning apparatus in which the moving speed of the arm 53 is constant.

As described above, in this embodiment, the moving speed AS of the arm 53 is made lower as the cleaning head 54 becomes closer to the edge of the substrate S. To put this the other way around, the moving speed of the arm 53 is made higher as the cleaning head 54 becomes closer to the center of the substrate S. In the vicinity of the center of the substrate S, the circumferential moving speed of the surface of the substrate S relative to the cleaning head 54 is low, and therefore, the cleaning performance is poor. However, the deterioration of the cleaning performance is reduced, as the moving speed of the arm 53, which is the moving speed in a radial direction of the cleaning head 54, is made higher.

As described above, the moving speed AS of the arm 53 is made lower as the cleaning head 54 becomes closer to the edge of the substrate S. In this manner, the cleaning performance of the cleaning head 54 is improved. Meanwhile, the time required for the cleaning head 54 to reach the edge of the substrate S, which is the time required for cleaning a single substrate S, becomes longer, and the productivity becomes lower. In view of this, the controller 60 controls the head rotating driver 64, so that the rotating speed HR of the cleaning head 54 becomes higher as the cleaning head 54 becomes closer to the edge of the substrate S in this embodiment, as shown in FIG. 7. In this manner, the cleaning performance per unit time is improved. Thus, the decrease in the moving speed AS of the arm 53 can be made smaller, and the decrease in the productivity can be reduced.

Furthermore, as described above, where the substrate S is supported at the edge, the substrate S has downward warpage due to its own weight. In a large-sized substrate like a 450-mm substrate, this warpage is more conspicuous. In the above described embodiment, however, the contact pressure of the sponge 541 on the surface of the substrate S is appropriately controlled. Thus, contact pressures are set at respective locations in accordance with changes in the in-plane height of the surface of the substrate S, and unintended increases and decreases in contact pressure due to warpage of the substrate S can be avoided.

Figure 13A:
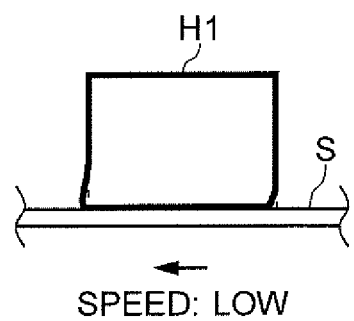
FIG. 13A is a cross-sectional view taken along the line A-A' in FIG. 12.
Figure 13B:
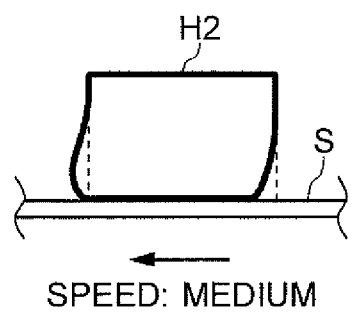
FIG. 13B is a cross-sectional view taken along the line B-B' in FIG. 12.
Figure 13C:
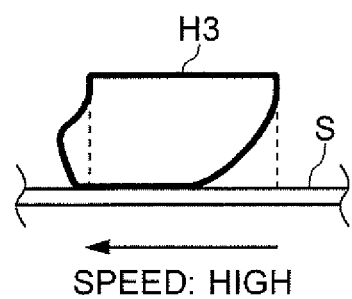
FIG. 13C is a cross-sectional view taken along the line C-C' in FIG. 12.

Further, as shown in FIGS. 13A and 13B, the moving speed of the surface of the substrate S relative to the cleaning head 54 becomes higher as the cleaning head 54 becomes closer to the edge of the substrate S. Therefore, if the contact pressure of the sponge 541 on the surface of the substrate S is constant, the surface of the substrate S drags the bottom surface (cleaning surface) of the sponge 541 of the cleaning head 54, and the sponge 541 is deformed. In this embodiment, on the other hand, the contact pressure of the sponge 541 on the surface of the substrate S is made lower as the cleaning head 54 becomes closer to the edge of the substrate S, as shown in FIG. 7. Thus, the deformation due to this dragging can be reduced. Although not shown in FIG. 7, when high cleaning performance is required at the outer circumference of the substrate S, control may be performed so that the contact pressure of the sponge 541 on the surface of the substrate S becomes higher as the cleaning head 54 becomes closer to the edge of the substrate S.

Furthermore, in a substrate cleaning apparatus in which a substrate S supported by the circumference supporting members 51 at the edge is rotated, the lower surface (cleaning surface) of the sponge 541 can move beyond the edge of the substrate S by virtue of swinging of the arm 53. Thus, the edge of the substrate S can be cleaned as well. However, if the pressure of the sponge 541 on the surface of the substrate S is constant, the contact area between the sponge 541 and the substrate S becomes smaller when the sponge 541 reaches the edge of the substrate S, and local stress concentration occurs in the sponge 541. In addition, the portion of the sponge 541 protruding from the edge of the substrate S is rubbed against the edge of the substrate S, and deteriorates. In this embodiment, on the other hand, the contact pressure of the sponge 541 on the surface of the substrate S is made lower immediately before the sponge 541 reaches the edge of the substrate S by virtue of swinging of the arm 53. Because of this, the above described trouble that occurs when the cleaning head 54 reaches the edge of the substrate S can be avoided or reduced.

It should be noted that it is possible to perform only part of the above described control on the moving speed AS of the arm 53, the rotating speed SR of the substrate S, the rotating speed HR of the cleaning head 54, and the contact pressure HP of the cleaning head 54 on the substrate S, in accordance with the location of the cleaning head 54 in a radial direction of the substrate S. For example, the rotating speed HR of the cleaning head 54 may be constant, and the rotating speed SR of the substrate S may be constant.

In the above description, various control operations to be performed when the cleaning head 54 moves from the center of the substrate S to the edge of the substrate S have been described. However, the cleaning head 54 may move from the edge to the center. In that case, control can also be performed in the same manner as above. Specifically, as the cleaning head 54 becomes closer to the center of the substrate S, the moving speed AS of the arm 53 is increased, the contact pressure of the sponge 541 on the surface of the substrate S is increased, the rotating speed of the substrate S is lowered, and the rotating speed of the cleaning head 54 is lowered. Further, the arm 53 may be operated in such a manner that the cleaning head 54 moves from the edge on one side of the substrate S toward the center of the substrate S, and, after passing through the center of the substrate S, moves toward the edge on the opposite side.

The following is a description of other example structures of substrate cleaning apparatuses. In the above described embodiment, one end of the arm 53 holds the cleaning head 54, and the arm 53 is rotated about the other end thereof so as to swing the cleaning head 54 and move the cleaning head 54 from the center of a substrate S to the edge of the substrate S. However, the other structures described below may also be employed to move the cleaning head 54 from the center of a substrate S to the edge of the substrate S.

Figure 8:
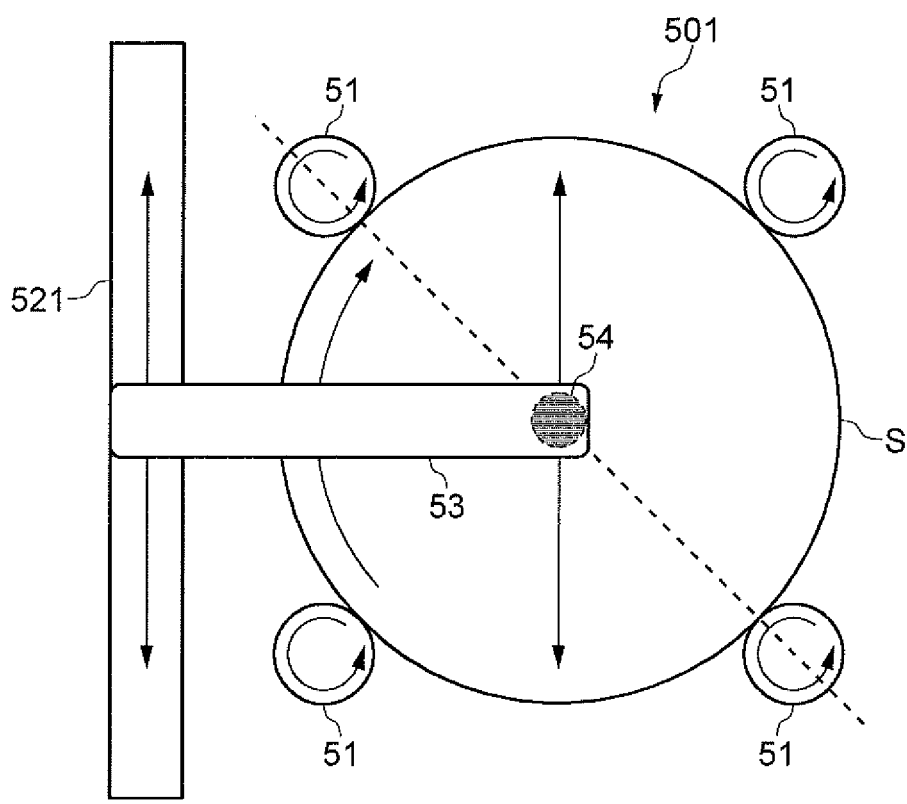
FIG. 8 is a plan view of the structure of a substrate cleaning apparatus according to a modification of the embodiment.

FIG. 8 is a plan view of the structure of a substrate cleaning apparatus according to a modification. As shown in FIG. 8, a substrate cleaning apparatus 501 horizontally holds a substrate S with four circumference instruction members 51. A cleaning head 54 is attached to the lower surface of one end of an arm 53, and the other end of the arm 53 is held by a rail 521 extending in a vertical direction on a side of the substrate S so that the other end of the arm 53 can move in the longitudinal direction of the rail 521. As the other end of the arm 53 moves along the rail 521, the arm 53 moves parallel to the rail 521. Accordingly, the cleaning head 54 attached to one end of the arm 53 moves parallel to the rail 521 and along the surface of the substrate S.

Figure 9A:
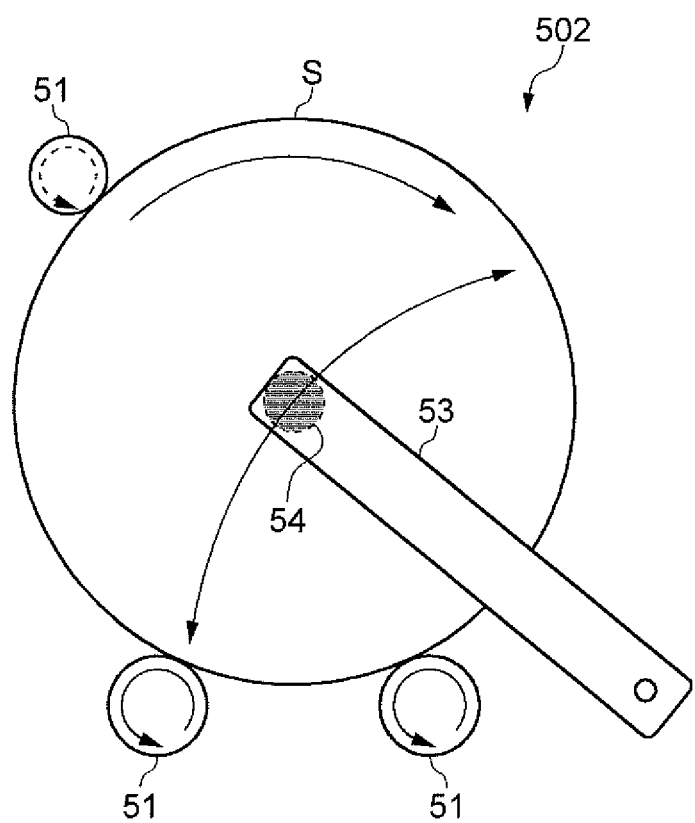
FIG. 9A is a plan view of the structure of a substrate cleaning apparatus according to another modification of the embodiment of the present technology.
Figure 9B:
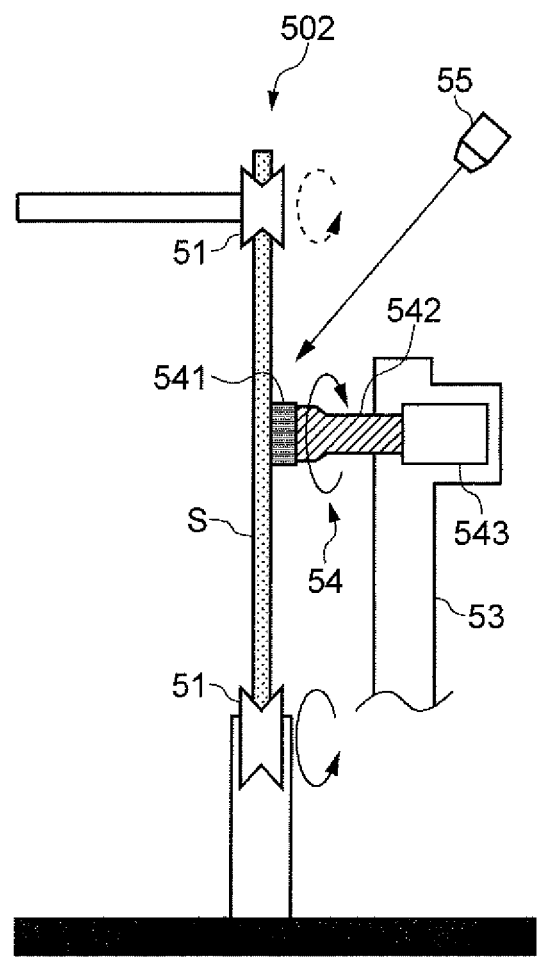
FIG. 9B is a side view of the structure of the substrate cleaning apparatus according to another modification of the embodiment of the present technology.

FIGS. 9A and 9B are a plan view and a side view of the structure of a substrate cleaning apparatus according to another modification. In a substrate cleaning apparatus 502 of this modification, a substrate S is vertically held by three circumference supporting members 51. The two circumference supporting members 51 on the lower side are rotatively driven, and the one circumference supporting member 51 on the upper side follows rotation of the substrate S and thus rotates. A cleaning head 54 is attached to one end of an arm 53. The other end of the arm 53 is rotatably supported. In the substrate cleaning apparatus 502 of this modification, a nozzle 55 supplies a solution such as a chemical liquid from obliquely above to the surface (the surface to be polished) of the substrate S.

Figure 10A:
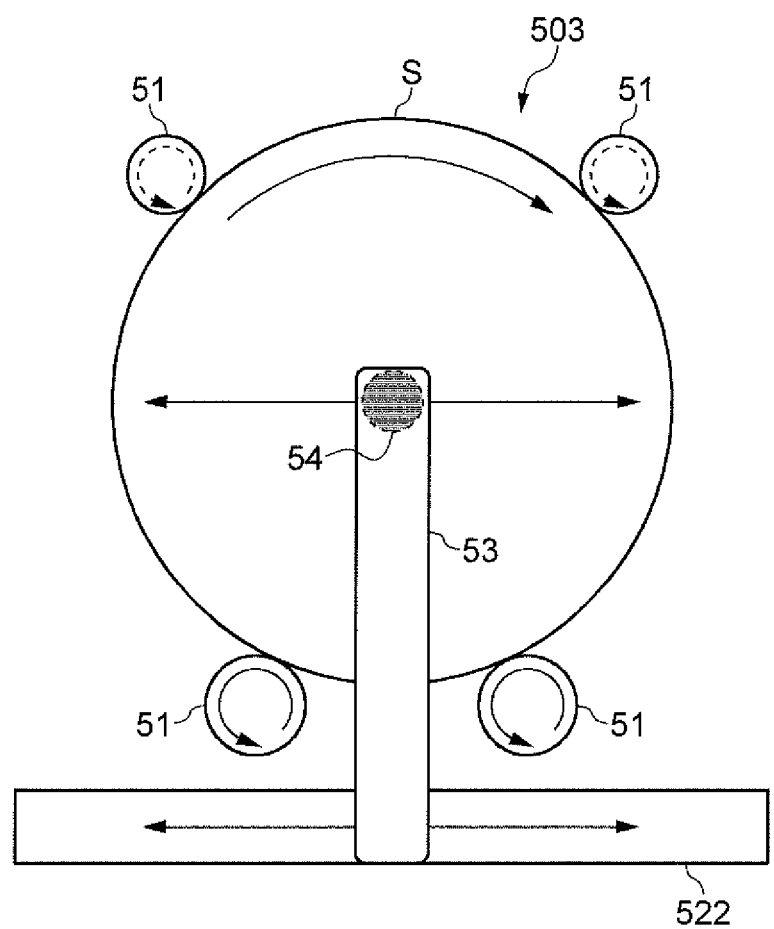
FIG. 10A is a plan view of the structure of a substrate cleaning apparatus according to another modification of the embodiment of the present technology.
Figure 10B:
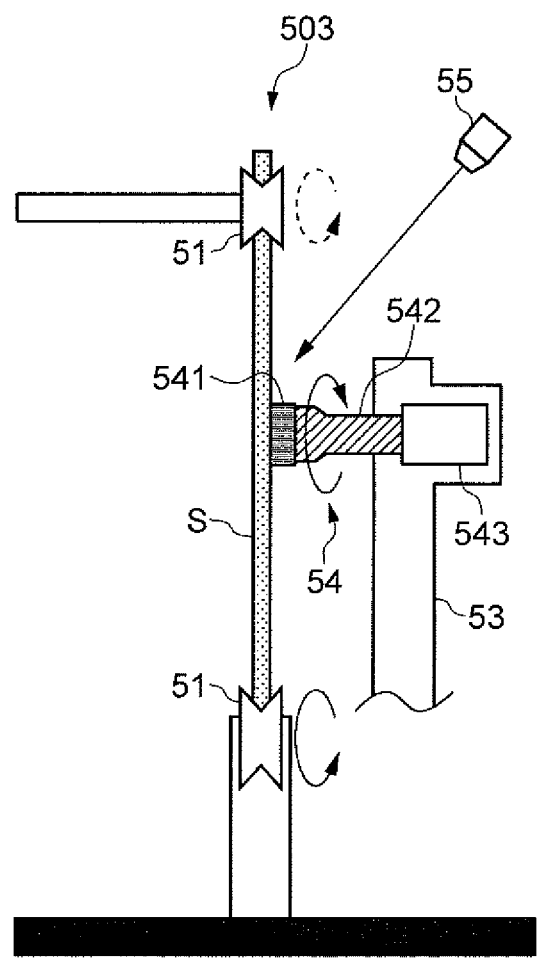
FIG. 10B is a side view of the structure of the substrate cleaning apparatus according to another modification of the embodiment of the present technology.

FIGS. 10A and 10B are a plan view and a side view of the structure of a substrate cleaning apparatus according to another modification. In a substrate cleaning apparatus 503 of this modification, a substrate S is also vertically held by circumference supporting members 51. The two circumference supporting members 51 on the lower side are rotatively driven, and the two circumference supporting members 51 on the upper side follow rotation of the substrate S and thus rotate. A cleaning head 54 is attached to one end of an arm 53. The other end of the arm 53 is supported by a rail 522 extending in a horizontal direction below the substrate S so that the other end of the arm 53 can move in the longitudinal direction of the rail 522. As the other end of the arm 53 moves along the rail 522, the arm 53 moves parallel to the horizontal direction. Accordingly, the cleaning head 54 moves in a horizontal direction along the surface of the substrate S.

Figure 11A:
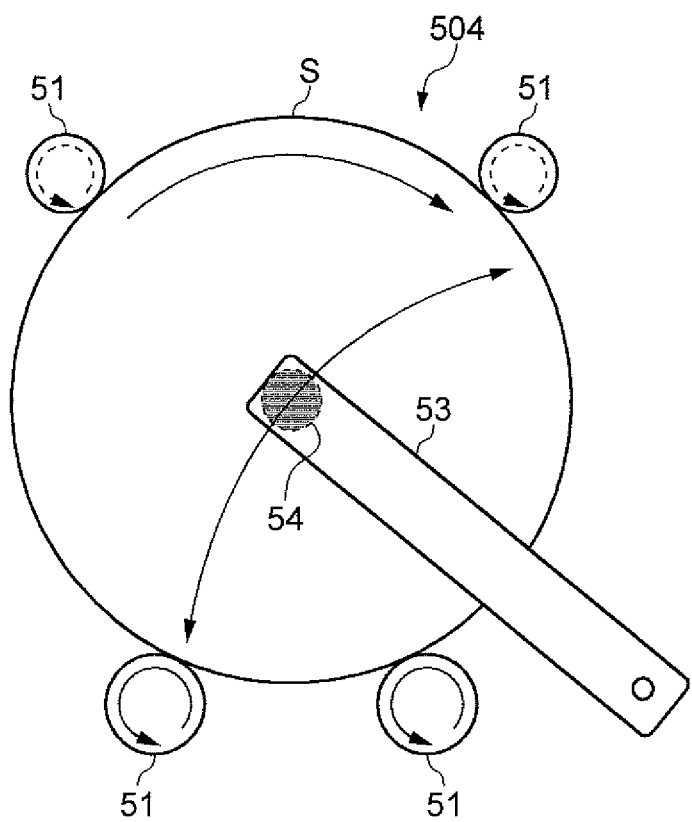
FIG. 11A is a plan view of the structure of a substrate cleaning apparatus according to another modification of the embodiment of the present technology.
Figure 11B:
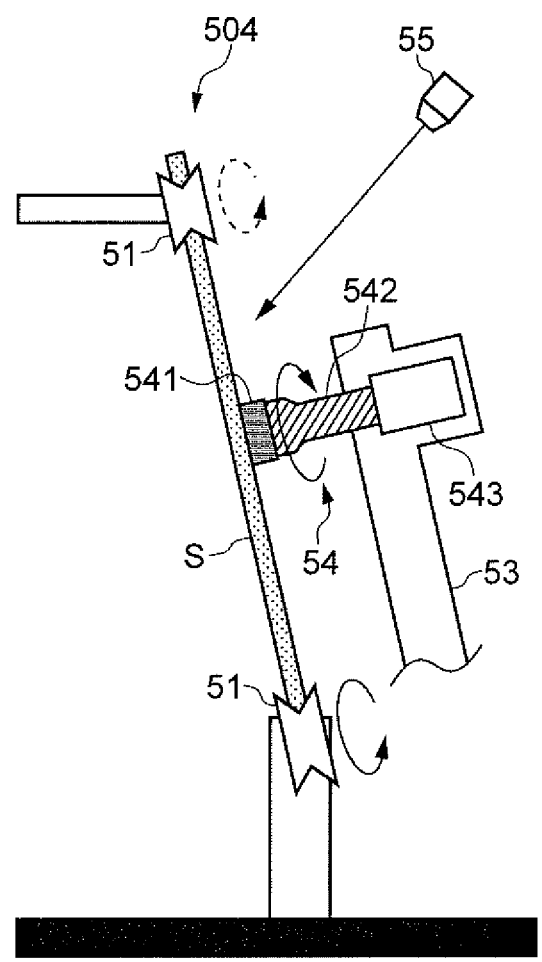
FIG. 11B is a side view of the structure of the substrate cleaning apparatus according to another modification of the embodiment of the present technology.
Figure 12:
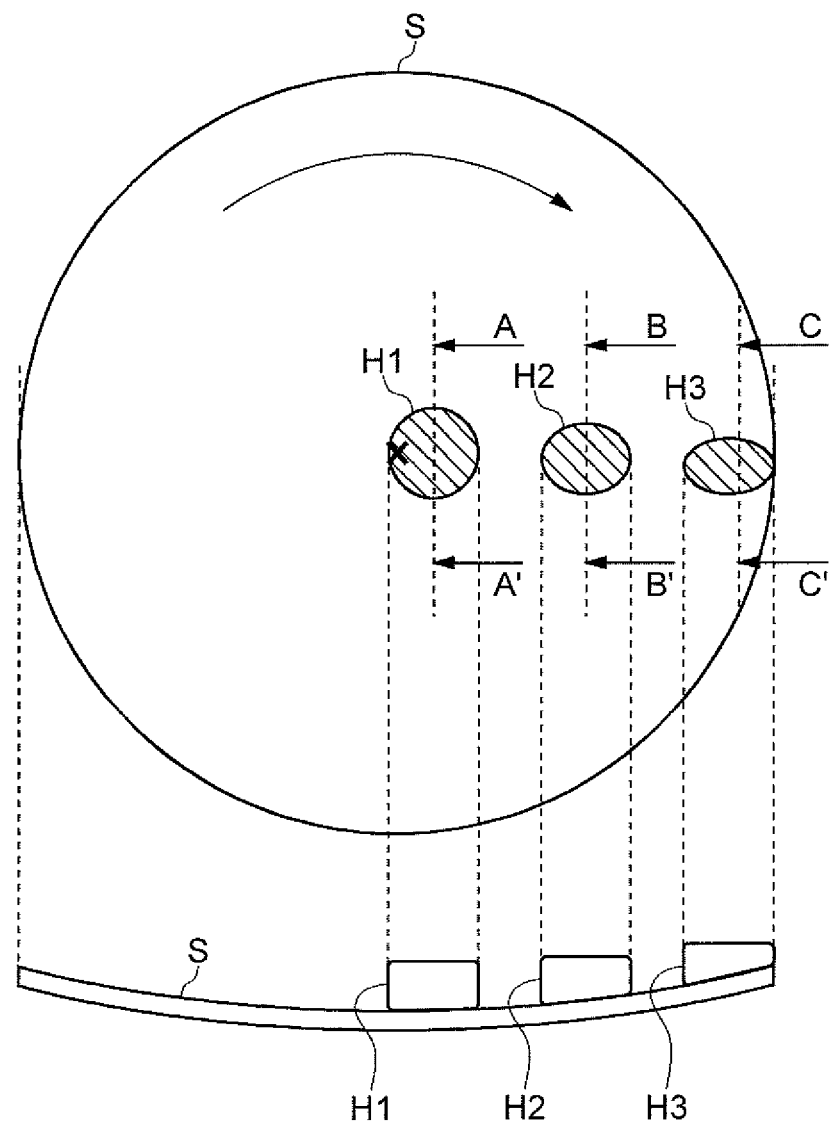
FIG. 12 is a plan view and a front view of a conventional cleaning head located at radial positions on a substrate.

FIGS. 11A and 11B are a plan view and a side view of the structure of a substrate cleaning apparatus according to another modification. In a substrate cleaning apparatus 504 of this modification, a substrate S is obliquely held. Circumference supporting members 51, an arm 53, a cleaning head 54, and a nozzles 55 have the same structures as those in the substrate cleaning apparatus 502 shown in FIGS. 9A and 9B, but are designed to obliquely hold and clean the substrate S.

In the embodiment and the modifications described above, the cleaning head 54 has the sponge 541, and the sponge 541 is brought into contact with the surface of the surface (the surface to be polished) of a substrate S, to scrub the surface of the substrate S. However, the cleaning head 54 may be designed to clean the surface of the substrate S in a non-contact manner with a two-fluid jet. The two-fluid jet cleaning head 54 mixes a liquid such as a chemical liquid with a gas, and jets the mixture onto the surface of a substrate S, to clean the surface of the substrate S.

In this case, it is possible to control the amount of fluid and the jet pressure, instead of controlling the rotating speed of the cleaning head 54 and the contact pressure of the sponge 541 on the surface of the substrate S as described above. Specifically, the amount of fluid may be increased as the cleaning head 54 becomes closer to the edge of the substrate S. In this manner, the amounts of liquid and gas to be jetted per unit area of the substrate S can be made constant.

Meanwhile, in the vicinities of the edge of the substrate S, the speed of the substrate relative to the cleaning head 54 is higher, and the substrate (particularly, a low-K material or the like) is damaged by jetting from a two-fluid jet in some cases. In such a case, the flow amount of the liquid may be lowered (M is lowered), the flow amount of the gas may be lowered (V is lowered), or both of the rates may be lowered, so that the kinetic energy $\frac{1}{2}MV^2$ (M being the mass of jetting, V being the velocity of jetting) becomes smaller at the circumference than at the center. As for the control on the rotating speed of the substrate, the moving speed of the arm, and the like, the same control as that of the above described embodiment can be performed to achieve the same effects as those described above.

In the embodiment and the modifications described above, the sponge 541 is moved up and down relative to the substrate S so as to vary the contact pressure between the cleaning surface of the sponge 541 and the surface of the substrate S to be cleaned. However, the substrate S may be lifted up and down so as to vary the contact pressure.

In the above described embodiment, the rotating speed SR of the substrate, the moving speed AS of the arm, the contact pressure HP of the cleaning head on the substrate, and the rotating speed HR of the cleaning head vary continuously from the center of the substrate S to the edge of the substrate S. However, those values may vary in a stepwise manner.

A preferred embodiment that is conceivable at present has been described so far. However, various modifications may be made to the embodiment of the present technology, and the claims should be construed as including all such modifications within the true spirit and scope of the present technology.

INDUSTRIAL APPLICABILITY

The present technology is useful as a substrate cleaning apparatus and a substrate cleaning method for cleaning the surface of a substrate while moving a cleaning head in a radial direction of the substrate.

REFERENCE SIGNS LIST

10 Housing
12 Load port
14a to 14d Polishing unit
16 First cleaning unit
18 Second cleaning unit
20 Drying unit 22 First substrate conveying robot
24 Substrate conveying unit
26 Second substrate conveying robot
28 Third substrate conveying robot
30 Controller
50 Substrate cleaning apparatus (substrate cleaning unit)
51 Circumference supporting member
52 Arm support pillar
53 Arm
54 Cleaning head
541 Sponge (scrubbing member)
542 Holder
543 Driver
55 Nozzle
60 Controller
61 Cleaning method storage
62 Arm swinging driver
63 Substrate rotating driver
64 Head rotating driver
65 Head elevating driver
S Substrate

The invention claimed is:

1. A substrate cleaning apparatus that cleans a substrate, the substrate cleaning apparatus comprising:
   a substrate rotating supporter configured to support and rotate the substrate;
   a scrubbing member comprising a cleaning surface configured to clean a surface to be cleaned of the substrate being rotated by the substrate rotating supporter, the cleaning surface being brought into contact with the surface to be cleaned;
   a movement mechanism configured to move the scrubbing member in a radial direction of the substrate while maintaining the cleaning surface in contact with the surface to be cleaned;
   an elevating mechanism configured to move the scrubbing member up and down; and
   a controller configured to control a contact pressure of the cleaning surface on the surface to be cleaned and a moving speed of the scrubbing member,
   wherein the controller is configured to control the elevating mechanism so that a first contact pressure is smaller than a second contact pressure, wherein the first contact pressure is applied when the scrubbing member is located near an edge of the substrate, and the second contact pressure is applied when the scrubbing member is located near a center of the substrate,
   wherein the controller is configured to control the elevating mechanism so that a third contact pressure is smaller than a fourth contact pressure, wherein the third contact pressure is applied when the cleaning surface overlaps the edge of the substrate, and the fourth contact pressure is applied when the cleaning surface does not overlap the edge of the substrate, and
   wherein the controller is configured to keep the moving speed of the scrubbing member constant before the scrubbing member reaches a location at a first distance from the center of the substrate, and the controller is configured to decrease the moving speed of the scrubbing member when the scrubbing member reaches the location at the first distance from the center of the substrate.

2. The substrate cleaning apparatus according to claim 1, wherein the controller further controls movement of the scrubbing member by the movement mechanism, and sets a first moving speed of the scrubbing member when the scrubbing member is located near the edge of the substrate to be smaller than a second moving speed when the scrubbing member is located near the center of the substrate.

3. The substrate cleaning apparatus according to claim 1, further comprising a rotation mechanism configured to rotate the scrubbing member,
   wherein the controller further controls rotation of the scrubbing member by the rotation mechanism, and sets a first rotating speed of the scrubbing member when the scrubbing member is located near the edge of the substrate to be greater than a second rotating speed of when the scrubbing member is located near the center of the substrate.

4. The substrate cleaning apparatus according to claim 1, wherein the controller controls rotation of the substrate by the substrate rotating supporter, and sets a first rotating speed of the substrate when the scrubbing member is located near the edge of the substrate to be greater than a second rotating speed of the substrate when the scrubbing member is located near the center of the substrate.

5. The substrate cleaning apparatus according to claim 1, wherein the controller varies the contact pressure while the cleaning surface is in contact with the center of the substrate.

6. The substrate cleaning apparatus according to claim 1, wherein
   the movement mechanism moves the scrubbing member on a first movement locus comprising a location where the cleaning surface overlaps the edge of the substrate, and
   the controller sets the third contact pressure when the cleaning surface overlaps the edge of the substrate to be smaller than the fourth contact pressure when the cleaning surface does not overlap the edge of the substrate.

7. The substrate cleaning apparatus according to claim 1, wherein the scrubbing member is a sponge.

* * * * *